United States Patent [19]

Sakurai et al.

[11] Patent Number: 4,740,713
[45] Date of Patent: Apr. 26, 1988

[54] MOS SEMICONDUCTOR INTEGRATED CIRCUIT IN WHICH THE PRODUCTION OF HOT CARRIERS NEAR THE DRAIN OF A SHORT N CHANNEL CONDUCTIVITY TYPE MOS TRANSISTOR IS DECREASED

[75] Inventors: Takayasu Sakurai, Tokyo; Tetsuya Iizuka, Funabashi, both of Japan

[73] Assignee: Kabushiki Kaisha Toshiba, Kawasaki, Japan

[21] Appl. No.: 815,026

[22] Filed: Dec. 30, 1985

[30] Foreign Application Priority Data

Jan. 26, 1985 [JP] Japan ................................. 60-13068

[51] Int. Cl.⁴ ..................... H03K 17/10; H03K 17/16
[52] U.S. Cl. .................. 307/200 B; 307/443; 307/451; 307/568; 307/579; 307/585; 307/296 R
[58] Field of Search ................. 307/200 B, 443, 451, 307/568, 571, 576, 577, 579, 584–585, 296 R, 297; 357/23.3

[56] References Cited

U.S. PATENT DOCUMENTS

| | | | |
|---|---|---|---|
| 3,818,245 | 6/1974 | Suzuki et al. | 307/577 X |
| 4,069,430 | 1/1978 | Masuda | 307/450 X |
| 4,317,055 | 2/1982 | Yoshida et al. | 307/584 X |
| 4,490,629 | 12/1984 | Barlow et al. | 307/579 X |
| 4,508,978 | 4/1985 | Reddy | 307/443 X |
| 4,513,303 | 4/1985 | Abbas et al. | 357/23.3 |
| 4,571,509 | 2/1986 | Tobita | 307/443 |
| 4,584,491 | 4/1986 | Ulmer | 307/443 X |

Primary Examiner—Stanley D. Miller
Assistant Examiner—D. R. Hudspeth
Attorney, Agent, or Firm—Oblon, Fisher, Spivak, McClelland & Maier

[57] ABSTRACT

Semiconductor integrated circuit of the present invention comprises a signal output terminal, a load circuit connected to the signal output terminal, a transistor circuit which is constituted by at least one first channel MOS transistor and has an output terminal connected to the signal output terminal and an input terminal connected to a signal input terminal, and a first channel enhancement type MOS transistor that is inserted between the transistor circuit's output terminal and the signal output terminal and is made normally in an on state. It is an object of the present invention to provide a highly reliable semiconductor integrated circuit in which no deterioration of characteristics due to hot carriers occurs even when the circuit is constituted using short channel MOS transistors with an effective channel length of about 1 micron or less.

5 Claims, 6 Drawing Sheets

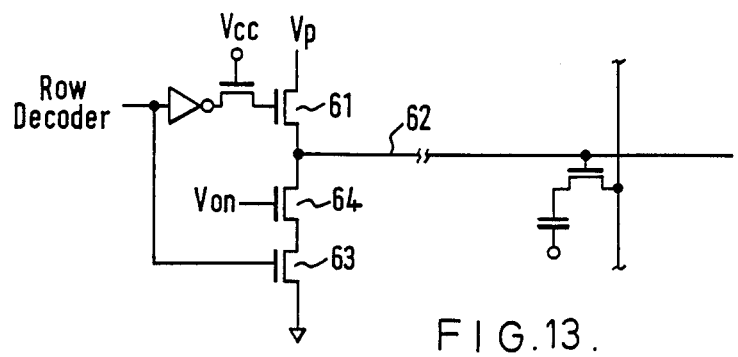
F I G. 13.
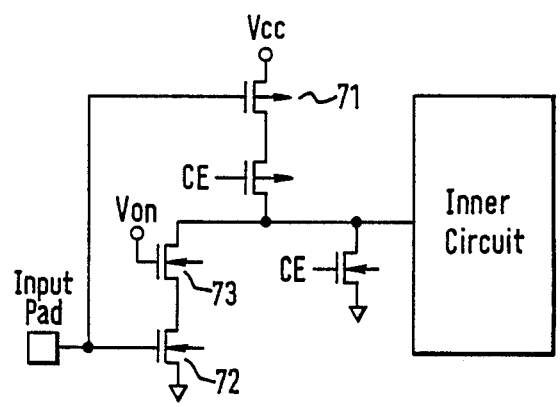
F I G. 14.
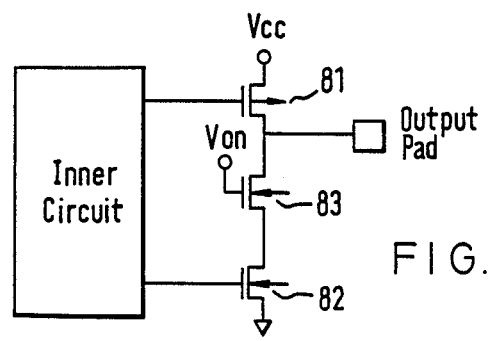
F I G. 15.

MOS SEMICONDUCTOR INTEGRATED CIRCUIT IN WHICH THE PRODUCTION OF HOT CARRIERS NEAR THE DRAIN OF A SHORT N CHANNEL CONDUCTIVITY TYPE MOS TRANSISTOR IS DECREASED

BACKGROUND OF THE INVENTION

1. Field of the Invention

This invention relates to a semiconductor integrated circuit that is very reliable. More particularly, the invention relates to a semiconductor integrated circuit using short channel MOS transistors with an effective channel length of about 1 micron or less.

2. Description of the Prior Art

It is known that if the effective channel length of a MOS transistor is about 1 micron or less, the threshold voltage and conductance fluctuate because of the effects of hot carriers produced in the vicinity of the drain. What is meant here by "about 1 micron" is an effective channel length of 1.2 microns, which is the minimum dimension formable with current MOS technology. The above-mentioned fluctuation of the threshold voltage and conductance caused by hot-carriers is called the hot carrier problem. This phenomenon is very troublesome since it reduces the reliability of VLSI circuits (very large scale integrated circuits) using short channel transistors with an effective channel length of about 1 micron or less and a variety of measures have been tried in the past to counter it. For example, there have been attempts to form a MOS transistor with small threshold voltage fluctuation by controlling the drain's impurity concentration distribution. However, this method gives an improvement that is only of the order of ten at most and still fails to achieve satisfactory reliability.

It is known that MOS transistor deterioration due to hot carriers is worse as the substrate current is greater.

FIG. 1 is a circuit diagram of a conventional inverter with a CMOS structure. As is well-known, this inverter is one in which p channel and n channel MOS transistors 1 and 2 have their gates and drains connected to one another, an input signal N1 is supplied to the common gate and an output signal N2 is obtained at the common drain.

FIG. 2(a) is an operating timing waveforms showing the variation of the input and output signals N1, N2 in this conventional inverter and FIG. 2(b) is an operating timing waveforms showing the variation of the corresponding substrate current Isub. FIG. 3 is a characteristic waveforms in which input and output signals N1 and N2 have been rewritten in the plane of the gate-source voltage Vgs and drain-source voltage Vds and to which equivalent substrate current curves also have been added. Curve Moff in this characteristic graph of FIG. 3 is the Vgs-Vds locus when the transistor 2 changes from the on to the off state, curve Mon is the Vgs-Vds locus when the transistor 2 changes from the off to the on state and the other curves are the curves of the equivalent substrate current of the substrate current Isub.

When the input signal N1 in the inverter of FIG. 1 changes from a low level to a high level and the p channel MOS transistor 1 changes from on to off and the n channel MOS transistor 2 from off to on, a large substrate current flows, as shown in FIG. 2(b). The reason for this is that, as shown in FIG. 3, the Vgs-Vds locus passes through the large substrate current region.

Thus, with a conventional circuit there is the problem that there is flow of a large substrate current because of hot carriers and considerable deterioration of the MOS transistor's characteristics occurs. Because of this there is very bad deterioration and a problem of reliability in conventional inverters. This does not just apply to inverters but similarly applies to logic circuits in general. A measure one can think of to counter this is to reduce the above-mentioned substrate current by lowering the power supply voltage from the normal 5 V to 3 V, in order to reduce the high electric field in the vicinity of the drain, but this method finishes by reducing the circuit's operating speed to about 3/5 of what it is with a 5 V power supply. Thus, short channel MOS transistors are deliberately used in order to produce high-speed, large-capacity VLSI circuits, but these initial purposes fail to be achieved because of reliability problems.

SUMMARY OF THE INVENTION

An object of the present invention is to provide a highly reliable semiconductor integrated circuit. An advantage of the present invention is that no deterioration of characteristics due to hot carriers occurs even when the circuit is constituted using short channel MOS transistors with an effective channel length of about 1 micron or less.

In order to achieve this object, in the semiconductor integrated circuit of the invention a first channel enhancement type MOS transistor that is normally on is inserted between the output terminal of a transistor circuit constituted by at least one first channel MOS transistor and a signal output terminal, thanks to which the electric field in the vicinity of the drain of the transistor constituting the transistor circuit is reduced, and so the locus of the transistor's gate-source voltage and drain-source voltage is controlled in a manner such that it does not pass through the large substrate current region, whereby the production of hot carriers in the vicinity of the drain is reduced, deterioration of characteristics is made small and high reliability is achieved.

BRIEF DESCRIPTION OF THE DRAWINGS

FIG. 12 to FIG. 17 are circuit diagrams of other embodiments of the invention.

DESCRIPTION OF THE PREFERRED EMBODIMENTS

One embodiments of the invention will now be described with reference to the attached drawings.

Figure 4:
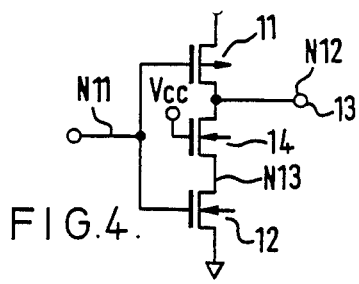
FIG. 4 is a circuit diagram showing the configuration of one embodiment of the invention.

FIG. 4 is a circuit diagram showing the configuration when a semiconductor integrated circuit of the invention is employed for an inverter which, similarly to what is done conventionally, has a CMOS structure. With the circuit of this embodiment, a conventional inverter constituted by p channel and n channel MOS transistors 11 and 12 further has the source-drain circuit of an n channel MOS transistor 14 inserted between the signal output terminal 13 and the n channel MOS transistor 12. This MOS transistor 14 has a set voltage, e.g., a positive voltage Vcc, supplied to its gate and is controlled so that it is normally in an on state. All the transistors, 11, 12 and 14 are constituted as short channel MOS transistors with an effective channel length of 1 micron or less, which can give problems of a high electric field in the vicinity of the drain.

Figure 1:
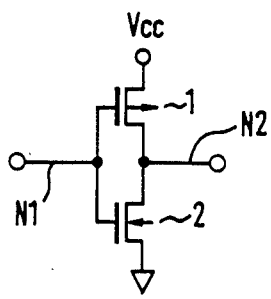
FIG. 1 is a circuit diagram of a conventional circuit.
Figure 2A:
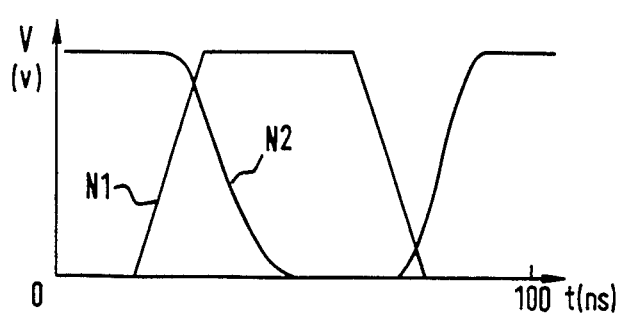
FIG. 2 is an operation timing waveforms in this conventional circuit.
Figure 2B:
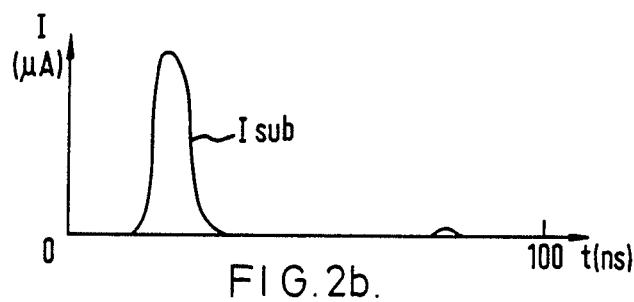
Figure 3:
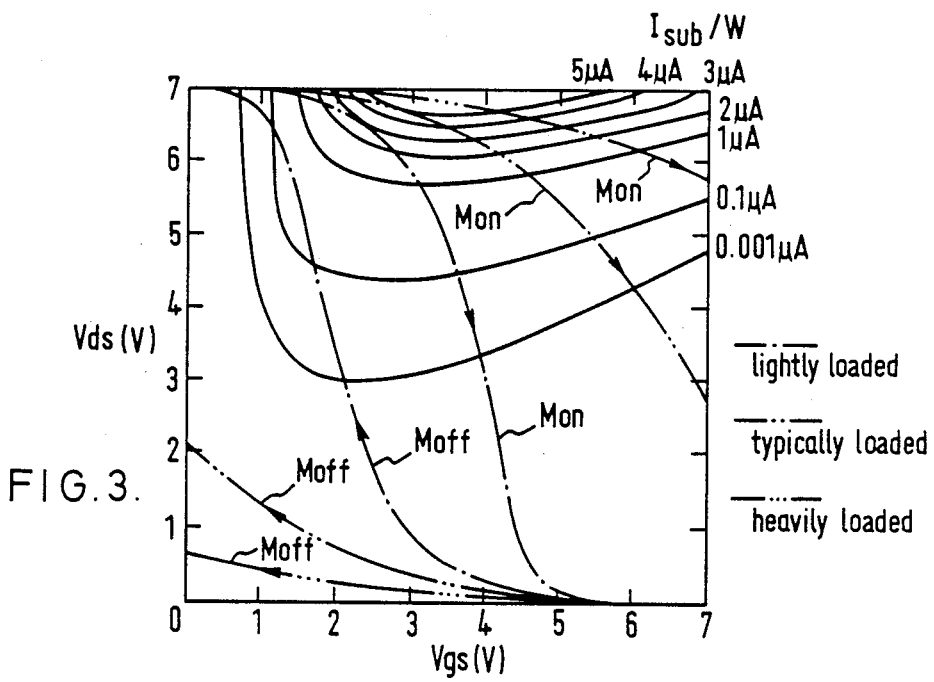
FIG. 3 is a characteristic graph of this conventional circuit.
Figure 5:
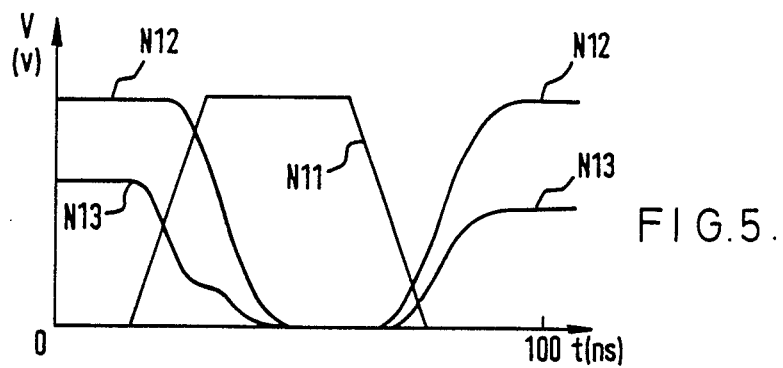
FIG. 5 is an operation timing waveforms in the circuit of this embodiment.
Figure 6:
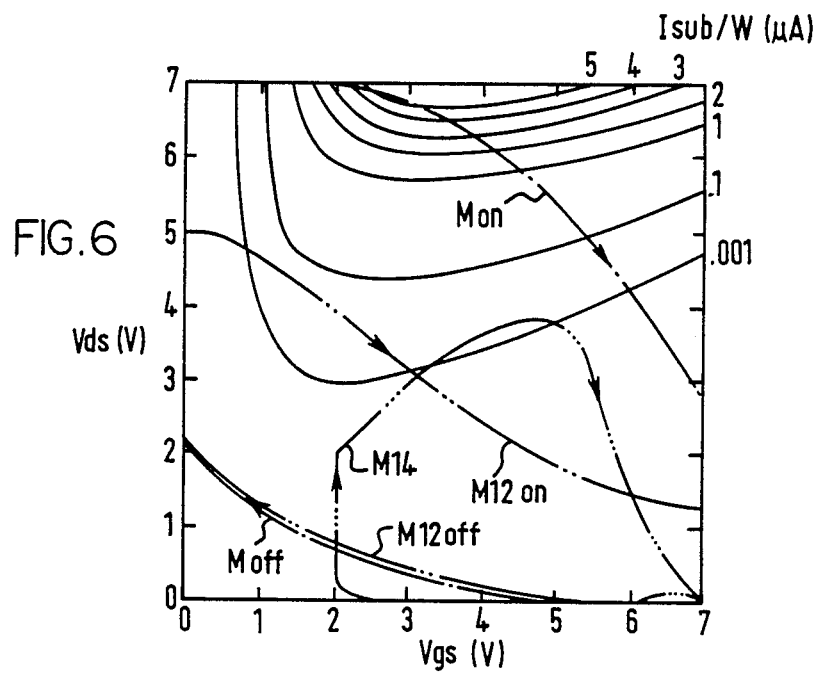
FIG. 6 is a characteristic graph of the circuit of this embodiment.

FIG. 5 is an operation timing waveforms showing the voltage changes of the input signal N11 supplied to the common gate of this inverter, the signal N12 that is output from the signal output terminal 13 and the signal N13 at the junction node of the transistors 14 and 12. FIG. 6 is a characteristic graph in which the input and output signals N11 and N12 are rewritten on the plane of the gate-source voltage Vgs and drain-source voltage Vds and to which equivalent substrate current curves also have been added. In this characteristic graph of FIG. 6, curve M12off is the Vgs-Vds locus when transistor 12 changes from an on state to an off state, curve M12on is the Vgs-Vds locus when transistor 12 changes from an off to an on state, curve M14 is the Vgs-Vds locus when transistor 14 changes from an on to an off or from an off to an on state and the other curves are the curves of the equivalent substrate current of the substrate current Isub. For the comparison, curves Moff and Mon in FIG. 3 also have been added in FIG. 6.

As seen from FIG. 6, even when it is maximum the Vgs-Vds locus only passes through a substrate current Isub region that is in the tenths of a micron range and compared to conventional inverters the substrate current is reduced by the order of $10^2$ to $10^3$. The quality of hot carriers produced is therefore reduced and there is an improvement of the order of $10^2$ to $10^3$ in reliability, i.e., life, compared to a conventional device.

A feature of the circuit of this embodiment is that the voltage amplitude of the signal at the transistor 12 and 14 junction node N13 is only about 3 V even in operation with a power supply voltage of 5 V. This is because the voltage amplitude of the node signal N13 is made lower than the output signal N12 by an amount corresponding to the threshold voltage of the transistor 14 (in this case, about 2 V).

Further, the operating speed in the inverter of this embodiment can be made about 10% or more faster than in the case where the power supply voltage is lowered from 5 V to 3 V. The reason for this is that the drain-source voltage Vds and the gate-source voltage Vgs of the MOS transistor 11 can be made 5 V and that the gate-source voltage Vgs of the MOS transistor 12 can be made 5 V.

As well as being practiced in an inverter as in the embodiment described above, the invention may also be practiced in other general logic circuits, etc. For example, the circuit of the embodiment shown in FIG. 7 is one in which the invention is practiced in a logic circuit which is constituted by a load circuit 22 having one terminal connected to a point where a positive supply voltage Vcc is imposed and its other terminal connected to a signal output terminal 21 and an n channel MOS transistor circuit 23 having one terminal connected to the signal output terminal and its other terminal connected to ground and in which the source-drain circuit of an n channel enhancement type MOS transistor 24 which has a set voltage Von supplied to its gate and is set to a normally on state is inserted between the signal output terminal 21 and the output terminal of the n channel transistor 23.

As in the embodiment described above, thanks to the insertion of the normally on MOS transistor 24, the electric field in the vicinity of the drain of the n channel MOS transistor constituting the transistor circuit 23 is reduced in a logic circuit with this configuration too. As a result, the transistor's gate-source voltage and drain-source voltage locus is controlled so that it does not pass through the large substrate current region during switching operation and hence the production of hot carriers in the vicinity of the drain is reduced. In other words, in this case too it is possible to produce a semiconductor integrated circuit which is subject to little deterioration of characteristics and is highly reliable.

Figure 7:
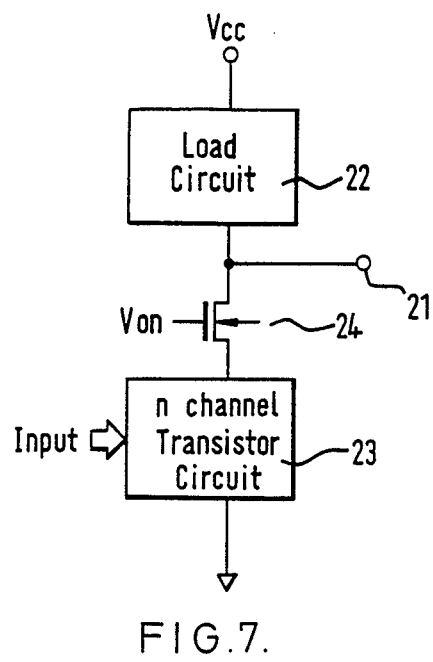
FIG. 7 is a circuit diagram showing the configuration of another embodiment of the invention.

A resistance of depletion type MOS transistor or a precharge type load circuit may be used as the load circuit in the circuit of the embodiment of FIG. 7. Also, the overall circuit configuration may be made a CMOS type and p channel transistor circuit 26 constituted by a p channel MOS transistor may be used as the load circuit 22, as in circuit of the embodiment shown in FIG. 8, the main point being that it is satisfactory as long as the configuration is made such that the supply voltage Vcc is not imposed directly on the transistor circuit 23 constituted by an n channel transistor.

Figure 8:
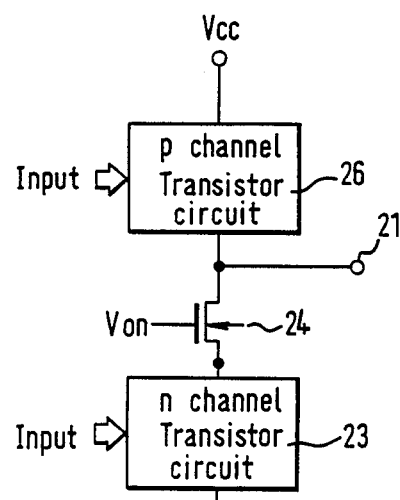
FIG. 8 is a circuit diagram showing the configuration of a further embodiment of the invention.
Figure 9:
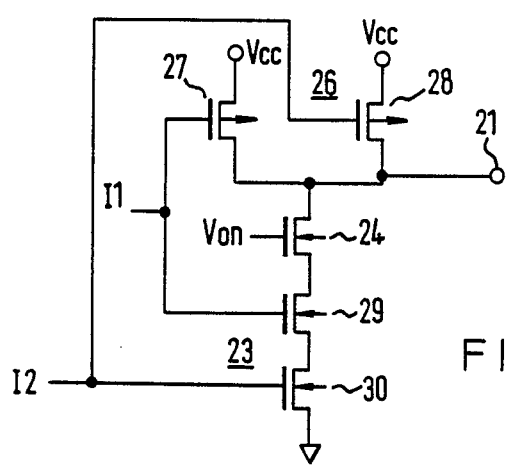
FIG. 9 is a circuit diagram of a specific example of the circuit of the embodiment of FIG. 8.

FIG. 9 is a circuit diagram of a specific example of the circuit of the embodiment of FIG. 8. A two-input NAND logic circuit is illustrated in this example. In this NAND logic circuit, the transistor circuit 26 is constituted by two p channel MOS transistors 27 and 28 whose source-drain circuits are connected in parallel between the Vcc supply point and the signal output terminal 21 and the transistor circuit 23 is constituted by two n channel MOS transistors 29 and 30 whose source-drain circuits are connected in series between the signal output terminal 21 and ground. The gates of the transistors 27 and 29 receive input of the same input signal I1 and the gates of the transistors 28 and 30 receive input of the same input signal I2.

Figure 10:
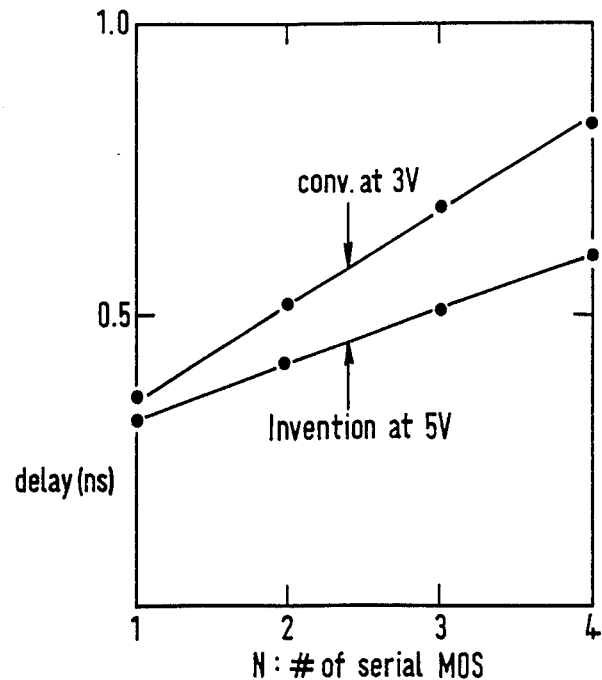
FIG. 10 is a graph showing the effect of the invention.

FIG. 10 shows a graph which the vertical axis shows the delay time and the horizontal axis shows the number of MOS transistor connected in series in the transistor circuit 23. Thus as shown in FIG. 10, in operation with a supply voltage of 5 V, the NAND logic circuit constituted in FIGS. 8 and 9 can achieve an operating speed that is around 20% to 30% better than operation at with a supply voltage of 3 V. This means that 5 V operation like that of a normal logic circuit can be effected, since even if Vcc is made 5 V the reliability is on a par with that obtaining when Vcc is 3 V.

Figure 11:
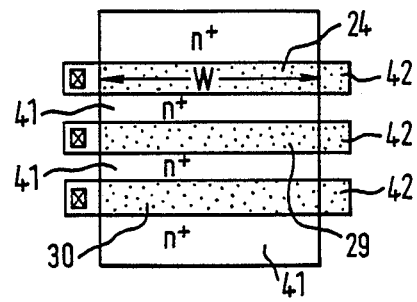
FIG. 11 is a plane view of the pattern when the circuit of FIG. 6 is made into an integrated circuit.

FIG. 11 is a plane view of the pattern at the n channel MOS transistor side when the circuit of FIG. 9 is actually made into an integrated circuit. In the figure, regions 41 are n+ type regions constituting transistor sources and drains and 42 are polycrystalline silicon layers that are provided between alternate regions 41 and constitute transistor gates, the transistors 24, 29 and 30 being formed in the locations indicated in the figure. Making the gate width, indicated by W in the figure, slightly larger for transistor 24 than in the other transistors 29 and 30 makes it possible to increase the operating speed.

If a normally on n channel MOS transistor is inserted in series for all the MOS transistors in an integrated circuit constituted by short channel MOS transistors, there is a possibility of the overall operating speed becoming slower. Because of this, there are cases in which it is preferable for an n channel MOS transistor that is made normally on to be selectively inserted only for the MOS transistor that discharges a node that is set at a voltage that is higher than the supply voltage Vcc. The reson for this is that the number of hot carriers produced in such a MOS transistor that discharges a node that is set at a voltage higher than Vcc is of the order of $10^2$ to $10^3$ greater than in the other transistors.

Figure 12:
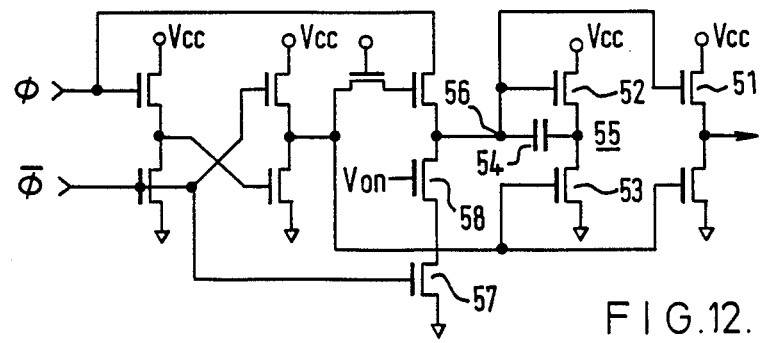

FIG. 12 and FIG. 13 show examples in which the invention is practiced in semiconductor integrated circuits in which there are provided transistors which discharge nodes that are set at a voltage that is higher than Vcc as noted above.

The circuit of FIG. 12 is one in which the invention is practiced in a known clock generation circuit for a dynamic RAM which produces clock signals with a timing offset from the timing of pulse signals $\phi$ and $\bar{\phi}$ of mutually complementary levels. This circuit is constituted using short channel n channel MOS transistors that all have an effective channel length of about 1 micron or less. In order to make the on resistance of an output stage transistor 51 connected to the point applied the supply voltage Vcc satisfactorily low in this clock generation circuit, the arrangement is made such that a voltage higher than the supply voltage Vcc is produced at a node 56 by a bootstrap circuit 55 constituted by transistor 52 and 53 and a capacitor 54 and when there is not need for the output stage transistor 51 to be brought into an on state the node 56 is discharged to ground by a MOS transistor 57. In this case, an extremely great quantity of hot carriers is produced in the vicinity of the drain of the transistor 57, since this vicinity is applied an electric field that is very high compared to that imposed on the other transistors. In other words, this transistor 57 is much more liable to deterioration that the other transistors. Therefore, in this embodiment, production of hot carriers in the vicinity of the drain of the transistor 57 is reduced, and hence the reliability of the transistor 57 is increased, by insertion of a MOS transistor 58 that is made normally on between the node 56 and the transistor 57.

In this manner, by selective application of the invention to a specific MOS transistor, it is made possible to improve reliability, i.e., life, by the order of $10^2$ to $10^3$ without reduction of speed and with the increase in area kept to a minimum.

The circuit of FIG. 13 is one in which the invention is practiced in a known word line selection drive circuit for a dynamic RAM. This circuit, also, is constituted entirely using short channel n channel MOS transistors with an effective channel length of 1 micron or less. In this circuit, a word line 62 is selectively driven in response to low decoder output by a high voltage Vp that is boosted to above the supply voltage Vcc by a bootstrap circuit not shown being to supplied to the work line 62 via a MOS transistor 61 or by the word line 62 that has been previously charged to a high voltage discharging to ground via a MOS transistor 63. As the vicinity of the drain of the transistor 63 is subject to imposition of an electric field that very high compared to that imposed on the other transistors, the quantity of hot carriers in this vicinity is very great and the transistor 63 is therefore much more liable to deterioration than the other transistors. What is done in this embodiment, therefore, is to inserts a MOS transistor 64 that is made normally on between the work line 62 and transistor 63 and thereby reduce production of hot carriers in the vicinity of the drain of the transistor 63 and so increase the reliability of the transistor 63.

FIG. 14 is a circuit diagram showing the configuration when the invention is employed for an input circuit of the semiconductor integrated circuit (IC). An input signal for the IC is applied at an input pad and transfered into an inner circuit. The input signal is input according to a chip enable signal (CE). There is a case that an intermediate voltage of the ordinary input signal is applied to the input pad according to the condition of using the IC in this circuit. In this case, the substrate current Isub becomes large and the quantity of hot carriers produced is increased in the conventional devices. However, as shown in FIG. 14 because a normally on MOS transistor 73 is inserted between the p channel MOS transistor 71 and n channel MOS transistor 72, the substrate current Isub is reduced, the quantity of hot carriers is therefor reduced and there is an improvement of the order of $10^2$ to $10^3$ in reliability compared to the conventional device.

FIG. 15 is a circuit diagram showing the configuration when this invention is employed for an output circuit of the IC. As shown in FIG. 15, a normally on n channel MOS transistor is inserted between a p channel MOS transistor 81 and n channel MOS transistor 82. It is different from the conventional device. In this embodiment the substrate current Isub and the quantity of hot carries produced is reduced and the reliability is improved in the same manner of the embodiment of FIG. 14.

Figure 16:
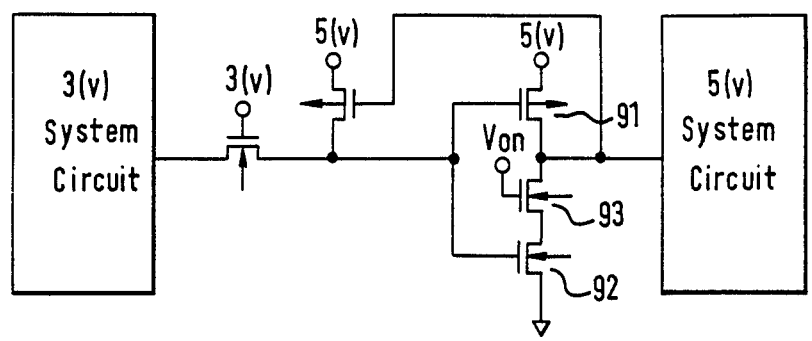

FIG. 16 is a circuit diagram showing the configuration when this invention is employed for the signal transfer circuit from the circuit driven by 3 V power supply to the circuit driven by 5 V power supply. In the same manner of the abovementioned embodiment, because a normally on n channel MOS transistor 93 is inserted between the p channel MOS transistor 91 and n channel MOS transistor 92, production of hot carriers in the vicinity of the drain of the transistor 92 is reduced, and hence the reliability of the transistor 92 is increased.

Figure 17:
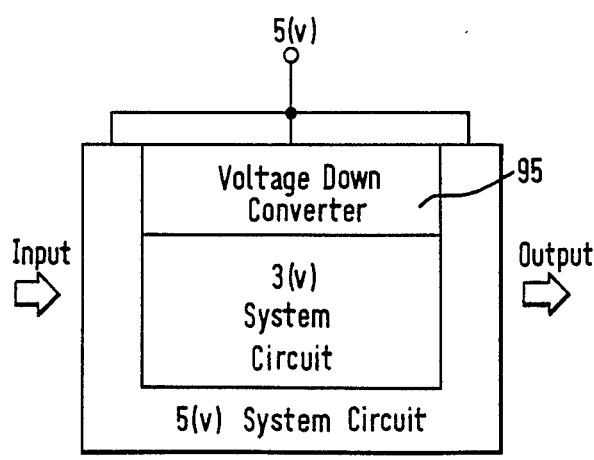

FIG. 17 is a circuit diagram showing the configuration when this invention is employed for the IC which has the circuit driven by 3 V power supply and the circuit driven by 5 V power supply. This invention is applied to the 5 V system circuit and a voltage down convertor 95 as shown in FIG. 17.

Needless to say, the invention is not restricted to the embodiments described above but it is possible to have a variety of modifications. For example, although description of the various embodiments above was given with reference to the case in which MOS transistors that are set in an on state are inserted between signal output terminals and the output terminals of transistor circuits constituted by n channel MOS transistor, it is also possible to provide p channel MOS transistor on the p channel MOS transistor side. As the production of hot carriers in a p channel MOS transistor is normally less than on the n channel side, it might be thought unnecessary to make special provision of a normally on p channel MOS transistor. Nevertheless, a transistor may be inserted in the same manner as for the n channel side in the case of short channel MOS transistors in which hot carrier production becomes a problem on the p channel side too.

Because of leakage current considerations, the threshold voltage of a MOS transistor cannot be made to small a value and cannot be made too low even when a 3 V power supply is used and this is a reason for reduction of the operating speed of a conventional circuit during 3 V operation.

The voltage supplied to the gates of the normally on transistors 14 and 24 in the circuits of the embodiments shown in FIG. 4, FIG. 7 and FIG. 8 need not be the power supply voltage Vcc but it is simply necessary to make the gate supply voltage Von a value such that, designating the threshold voltage that is subject to substrated bias effects in the transistor 14 or 24 as $V_{TH}$, it satisifies the relation $(Von - V_{TH}) < Vcc$.

As described above, since the value of the substrate current in the semiconductor integrated circuit of the invention is of the order of $10^2$ to $10^3$ times smaller than it is conventionally, it is made possible to prevent the deterioration of reliability which is a problem in short channel MOS transistors with an effective channel length of 1 micron or less.

What is claimed is:

1. Semiconductor integrated circuit having a signal input terminal, a signal output terminal, and a power supply terminal to which is supplied a power supply voltage, comprising:
    a load circuit connected to the signal output terminal, wherein the load circuit comprises at least one p channel conductivity type MOS transistor;
    a transistor circuit comprising at least one short n channel conductivity type MOS transistor and having an output terminal connected to the signal output terminal and an input terminal connected to the signal input terminal; and
    n channel conductivity enhancement type MOS transistor means for decreasing the production of hot carriers in the vicinity of the drain of the short n channel conductivity type MOS transistor, said MOS transistor means coupled between the output terminal of the transistor circuit and the signal output terminal and made normally in an on state;
    wherein the signal output terminal is set at a voltage which is higher than the power supply voltage.

2. Semiconductor integrated circuit as claimed in claim 1, wherein an effective channel length of the short n channel conductivity type MOS transistor is about 1 micron or less.

3. Semiconductor integrated circuit as claimed in claim 1, wherein an external input signal is directly inputted into the signal input terminal from an input pad.

4. Semiconductor integrated circuit as claimed in claim 1, wherein an external output signal is directly outputted from the signal output terminal to an output pad.

5. Semiconductor integrated circuit having a signal input terminal and a signal output terminal, comprising:
    a load circuit connected to the signal output terminal, wherein the load circuit comprises at least one p channel conductivity type MOS transistor;
    a transistor circuit comprising at least one short n channel conductivity type MOS transistor and having an output terminal connected to the signal output terminal and an input terminal connected to the signal input terminal; and
    n channel conductivity enhancement type MOS transistor means for decreasing the production of hot carriers in the vicinity of the drain of the short n channel conductivity type MOS transistor, said MOS transistor means coupled between the output terminal of the transistor circuit and the signal output terminal and made normally in an on state;
    wherein the semiconductor integrated circuit is driven by at least two power supply systems including a lower power supply system and a higher power supply system and the signal input terminal is coupled to the lower power supply system and the signal output terminal is coupled to the higher power supply system.

* * * * *